United States Patent
Park (10) Patent No.: US 8,699,285 B2
(45) Date of Patent: Apr. 15, 2014

(54) SEMICONDUCTOR MEMORY DEVICE AND INTEGRATED CIRCUIT

(75) Inventor: Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 180 days.

(21) Appl. No.: 13/118,674

(22) Filed: May 31, 2011

(65) Prior Publication Data

US 2011/0299348 A1 Dec. 8, 2011

(30) Foreign Application Priority Data

Jun. 4, 2010 (KR) .................. 10-2010-0052966

(51) Int. Cl.
*G11C 7/00* (2006.01)
(52) U.S. Cl.
USPC .......................................................... 365/193

(58) Field of Classification Search
USPC .......................................................... 365/193
See application file for complete search history.

(56) References Cited

U.S. PATENT DOCUMENTS 8,045,357 B2 * 10/2011 Ogiwara et al. .............. 365/145

* cited by examiner

*Primary Examiner* — Anthan Tran
(74) *Attorney, Agent, or Firm* — William Park & Associates Patent Ltd.

(57) ABSTRACT

A semiconductor memory device includes a write control signal generating circuit and a write enable signal generating unit. The write control signal generating circuit is configured to generate a write control signal activated during a time period from an input time point of a read command to an end time point of a data output time period. The write enable signal generating unit is configured to output a write command as a write enable signal in response to the write control signal.

9 Claims, 9 Drawing Sheets

FIG. 12

SEMICONDUCTOR MEMORY DEVICE AND INTEGRATED CIRCUIT

CROSS-REFERENCES TO RELATED APPLICATIONS

The present application claims priority under 35 U.S.C 119(a) to Korean Application No. 10-2010-0052966, filed on Jun. 4, 2010, in the Korean intellectual property Office, which is incorporated herein by reference in its entirety set forth in full.

BACKGROUND

A semiconductor memory device is a general term for storage media that are used to store data in computers or communication equipments. Semiconductor memory devices are classified into DRAM devices, SRAM devices, flash memory devices and ROM devices according to their data storage methods, and the DRAM devices are being most widely used among them.

Figure 1:
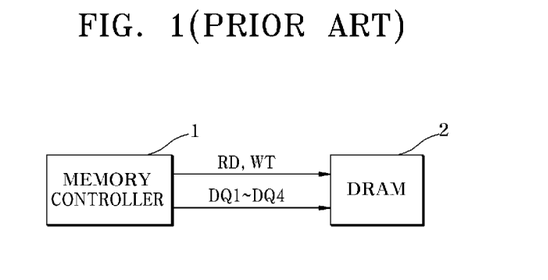
FIGS. 1 and 2 are block diagrams illustrating known integrated circuits.
Figure 2:
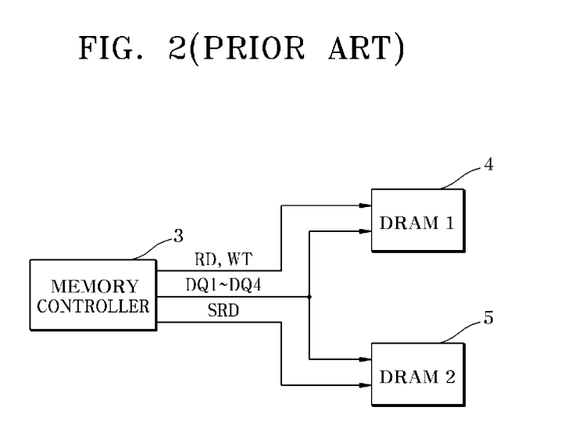
Figure 3:
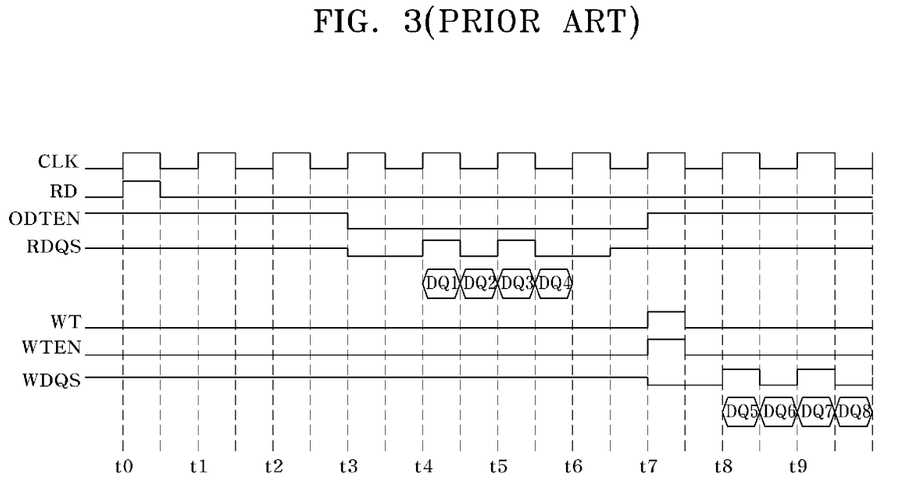
FIG. 3 is a timing diagram illustrating an operation of the integrated circuit illustrated in FIG. 1.
Figure 4:
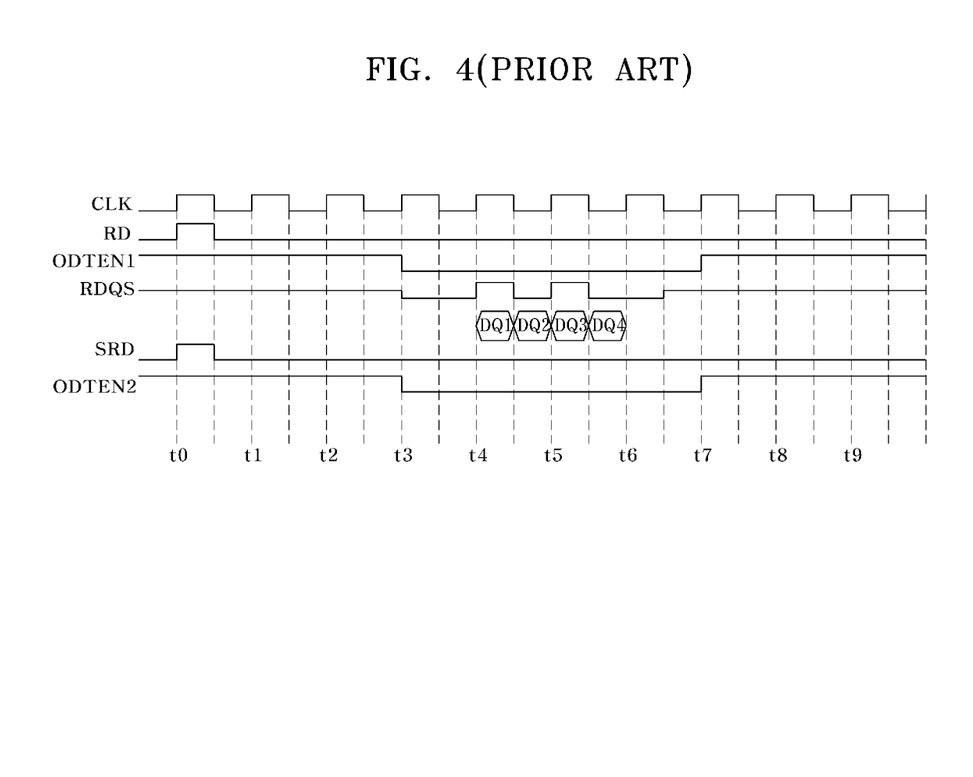
FIG. 4 is a timing diagram illustrating an operation of the integrated circuit illustrated in FIG. 2.

FIGS. 1 and 2 are block diagrams illustrating known integrated circuits. FIG. 3 is a timing diagram illustrating an operation of the integrated circuit illustrated in FIG. 1. FIG. 4 is a timing diagram illustrating an operation of the integrated circuit illustrated in FIG. 2.

According to data storage capacity, an integrated circuit may include a memory controller 1 and a semiconductor memory device 2 as illustrated in FIG. 1, or may include a memory controller 3 and semiconductor memory devices 4 and 5 shared by the memory controller 3 as illustrated in FIG. 2. That is, as the integration density of an integrated circuit increases, the number of semiconductor memory devices shared by a memory controller increases as illustrated in FIG. 2.

Hereinafter, an operation of the integrated circuit illustrated in FIG. 1 will be described with reference to FIG. 3.

The semiconductor memory device 2 receives a read command RD from the memory controller 1 at time t0, and deactivates an ODT enable signal ODTEN to a low level during a time period from a time t3 to a time t7. Here, the ODT enable signal ODTEN is a signal that is activated to a high level to operate an On Die Termination (ODT) circuit. In the semiconductor memory device 2, the ODT enable signal ODTEN is deactivated to a low level during a data output time period for a read operation to interrupt an operation of the ODT circuit in order not to perform a write operation.

In the time period when the ODT enable signal is deactivated to a low level, the semiconductor 2 receives a toggling read data strobe signal RDQS and outputs data DQ1, . . . , DQ4 sequentially in synchronization with a rising edge and a falling edge of the read data strobe signal RDQS.

At the time t7 when the data output time period for a read operation ends, the semiconductor memory device 2 which has received a write command WT from the memory controller 1, generates a write enable signal WTEN activated to a high level for a write operation, and receives a toggling write data strobe signal WDQS from the memory controller 1 in response to the write enable signal WTEN. The semiconductor memory device 2 receives data DQ5, . . . , DQ8 sequentially in synchronization with a rising edge and a falling edge of the write data strobe signal WDQS.

Hereinafter, an operation of the integrated circuit illustrated in FIG. 2 will be described with reference to FIG. 4.

The semiconductor memory device 4 receives a read command RD from the memory controller 3 at time t0, and deactivates a first ODT enable signal ODTEN1 to a low level during a time period from a time t3 to a time t7. Here, the first ODT enable signal ODTEN1 is a signal that is activated to a high level to operate an On Die Temination (ODT) circuit included in the semiconductor memory device 4. In the semiconductor memory device 4, the first ODT enable signal ODTEN1 is deactivated to a low level in a data output time period for a read operation to interrupt an operation of the ODT circuit in order not to perform a write operation.

On the other hand, the semiconductor memory device 5 receives a snoop read command SRD from the memory controller 3 at time t0, and deactivates a second ODT enable signal ODTEN2 to a low level during the time period from the time t3 to the time t7. Here, the second ODT enable signal ODTEN2 is a signal that is activated to a high level to operate an On Die Temination (ODT) circuit included in the semiconductor memory device 5. In the semiconductor memory device 5, the second ODT enable signal ODTEN2 is deactivated to a low level during a data output time period for a read operation to interrupt an operation of the ODT circuit in order not to perform a write operation.

The reason for applying the snoop read command SRD, to the semiconductor memory device 5 not performing a read operation, is to prevent the semiconductor memory device 5 from performing a write operation during the data output time period in the read operation of the semiconductor memory device 4.

As described above, when the semiconductor memory device 4 performs a read operation, the first ODT enable signal ODTEN1 and the second ODT enable signal ODTEN2 are deactivated to a low level during the data output time period for a read operation to prevent the semiconductor memory devices 4 and 5 from performing a write operation.

However, there is a case where a false write command is applied to the semiconductor memory device 4 of the semiconductor memory device 5 due to a channel/power noise during the time period from time t0 to time t3, at which the read command RD is inputted. In this case, a malfunction may occur because a write operation of the semiconductor memory device 4 or the semiconductor memory device 5 is performed during the data output time period in the read operation of the semiconductor memory device 4.

SUMMARY

An embodiment of the present invention relates to a semiconductor memory device and an integrated circuit (IC) including the same, which can reduce a probability of an occurrence of a malfunction between semiconductor memory devices shared by a memory controller.

In an embodiment, a semiconductor memory device includes a write control signal generating circuit configured to generate a write control signal activated during a time period from an input time point of a read command to an end time point of a data output time period, and a write enable signal generating unit configured to output a write command as a write enable signal in response to the write control signal.

In another embodiment, a semiconductor memory device includes an On Die Termination (ODT) enable signal generating unit configured to generate an ODT enable signal for controlling an ODT circuit in response to a snoop read command, a control signal generating unit configured to generate a control signal whose activation time period is determined in response to the ODT enable signal, a write control signal outputting unit configured to generate a write control signal whose activation time period is determined in response to the control signal and the ODT enable signal, and a write enable signal generating unit configured to output a write command as a write enable signal according to the write control signal.

In yet another embodiment, an integrated circuit includes a first semiconductor memory device configured to receive a read command at a first time point and deactivate a first write enable signal during a time period from the first time point to an end time point of a data output time period, and a second semiconductor memory device configured to receive a snoop read command at the first time point and deactivate a second write enable signal during a time period determined according to a burst length before the data output time period.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 5:
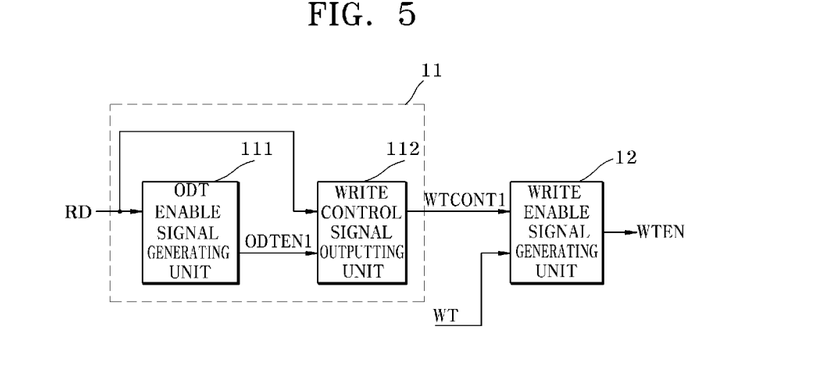
FIG. 5 is a block diagram of a semiconductor memory device according to an embodiment of the present invention.
Figure 6:
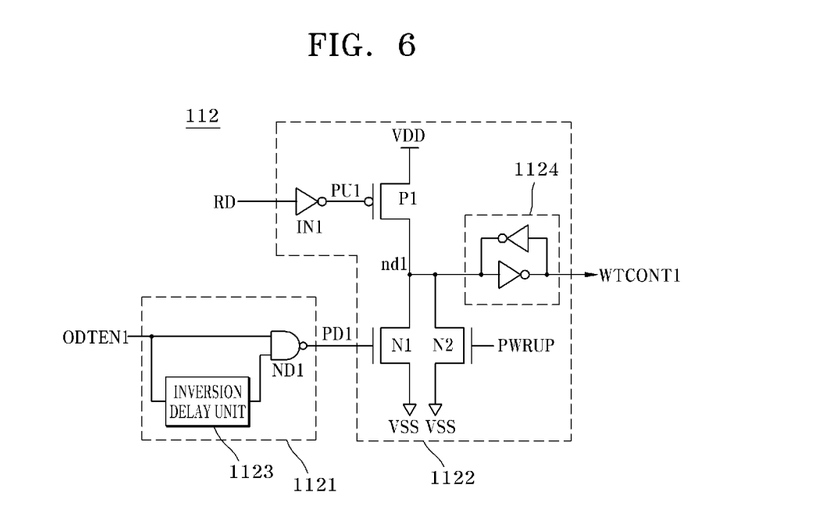
FIG. 6 is an circuit diagram of a write control signal outputting unit included in the semiconductor memory device illustrated in FIG. 5.
Figure 7:
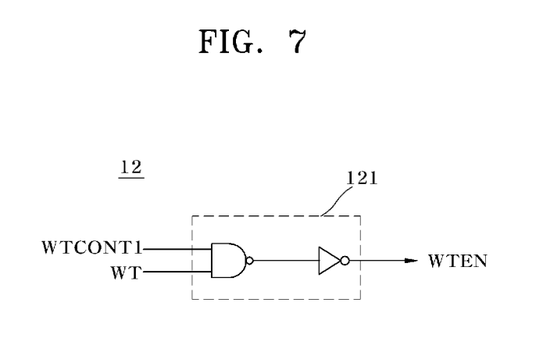
FIG. 7 is an circuit diagram of a write enable signal generating unit included in the semiconductor memory device illustrated in FIG. 5.
Figure 8:
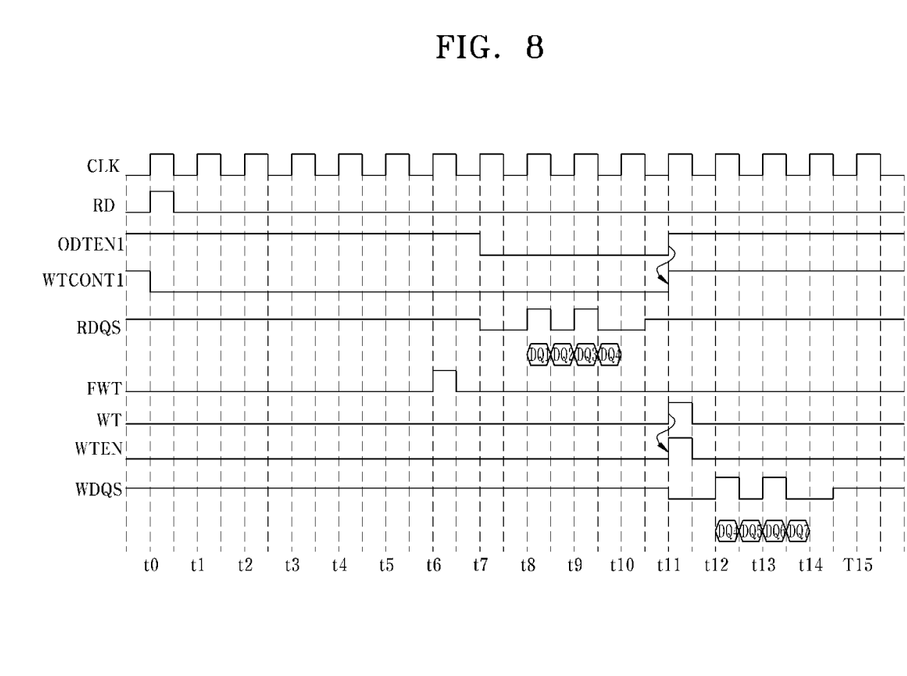
FIG. 8 is a timing diagram illustrating an operation of the semiconductor memory device illustrated in FIG. 5.

FIG. 5 is a block diagram of a semiconductor memory device according to an embodiment of the present invention. FIG. 6 is an circuit diagram of a write control signal outputting unit included in the semiconductor memory device illustrated in FIG. 5. FIG. 7 is an circuit diagram of a write enable signal generating unit included in the semiconductor memory device illustrated in FIG. 5. FIG. 8 is a timing diagram illustrating an operation of the semiconductor memory device illustrated in FIG. 5.

Referring to FIG. 5, a semiconductor memory device according to an embodiment of the present invention includes a write control signal generating unit 11 and a write enable signal generating unit 12.

The write control signal generating unit 11 includes an On Die Termination (ODT) enable signal generating unit 111 and a write control signal outputting unit 112. The ODT enable signal generating unit 111 generates a first ODT enable signal ODTEN1 that is deactivated to a low level during a certain time period in response to a read command RD. The first ODT enable signal ODTEN1 becomes deactivated to a low level at the time point after a time period set according to a Column Address Strobe (CAS) latency CL from the input time point of the read command RD. In order to secure a data output margin in a read operation, the low-level first ODT enable signal ODTEN1 becomes activated to a high level at the time point, after a time period set according to a burst length BL plus a 2tCK time period, from the time point of the deactivation to a low level. For example, if the CAS latency CL is set to '3' and the burst length BL is set to '4', the first ODT enable signal ODTEN1 is deactivated to a low level at the time point after a 3tCK time period from the input time point of the read command RD, and is activated to a high level at the time point after a 2tCK time period set by the burst length BL plus a 2tCK time period set for a data output margin from the time point of the deactivation to a low level. In the case of DDR2, if the burst length is set to '4', data are inputted/outputted during a 2tCK time period of clock signal.

Referring to FIG. 6, the write control signal outputting unit 112 includes a pull-down signal generating unit 1121 and a driving unit 1122. The pull-down signal generating unit 1121 is configured to generate a first pull-down signal PD1 in response to the first ODT enable signal ODTEN1. The driving unit 1122 is configured to drive a first write control signal WTCONT1 in response to the read command RD and the first pull-down signal PD1.

The pull-down signal generating unit 1121 includes an inversion delay unit 1123 and a NAND gate ND1. The inversion delay unit 1123 is configured to invert and delay the first ODT enable signal ODTEN1. The NAND gate ND1 is configured to perform a logical NAND operation on the first ODT enable signal ODTEN1 and the output signal of the inversion delay unit 1123, and output the first pull-down signal PD1. Thus, the pull-down signal generating unit 1121 generates the first pull-down signal PD1 that maintains a low level from the time point of the transition of the first ODT enable signal ODTEN1 from low level to high level, to the time point after a delay time period of the inversion delay unit 1123.

The driving unit 1122 includes an inverter IN1, a PMOS transistor P1, and an NMOS transistor N1. The inverter IN1 is configured to invert the read command RD and generate a first pull-up signal PU1. The PMOS transistor P1 operates as a pull-up driving element that is coupled between a power supply voltage VDD and a node nd1, and pulls up the voltage of the node nd1 in response to the output signal of the inverter IN1. The NMOS transistor N1 operates as a pull-down driving element that is coupled between a ground voltage VSS and the node nd1, and pulls down the voltage of the node nd1 in response to the first pull-down signal PD1. The driving unit 1122 further includes an NMOS transistor N2 and a latch unit 1124. The NMOS transistor N2 operates as a pull-down driving element that is coupled between the ground voltage VSS and the node nd1, and pulls down the voltage of the node nd1 in response to a power-up signal PWRUP. The latch unit 1124 is configured to latch the output signal of the node nd1.

Thus, the write control signal outputting unit 112 generates the first write control signal WTCONT1 that has a low level from the input time point of the read command RD to the time point of the transition of the first ODT enable signal ODTEN1 to a high level.

Referring to FIG. 7, the write enable signal generating unit 12 includes a logic unit 121. The logic unit 121 is configured to perform a logical AND operation on a write command signal WT and the first write control signal WTCONT1, and output a write enable signal WTEN. Thus, during the low-level time period of the first write control signal WTCONT1, the write enable signal generating unit 12 does not generate the write enable signal WTEN activated to a high level, even when the write command WT is inputted.

An operation of the above semiconductor memory device will be described below with reference to FIGS. 5 to 8. Here, it is assumed that the CAS latency CL is set to '7' and the burst length BL is set to '4'.

Referring to FIGS. 5 to 8, when the read command RD is inputted at time t0, the first ODT enable signal ODTEN1 generated by the ODT enable signal generating unit 111 is deactivated to a low level during a time period from a time t7 to a time t11. During the time period from the time t7 to the time t11 when the first ODT enable signal ODTEN1 is deactivated to a low level, data DQ1, . . . , DQ4 are sequentially outputted in synchronization with a read data strobe signal RDQS.

The write control signal outputting unit 112 generates the first write control signal WTCONT1 that has a low level from the input time point t0 of the read command RD to the time point t11 of the transition of the first ODT enable signal ODTEN1 from low level to high level.

During the low-level time period of the first write control signal WTCONT1, the write enable signal WTEN is not activated to a high level even when the write command signal WT is inputted. That is, during the low-level time period of the first write control signal WTCONT1, the write enable signal generating unit 12 deactivates the write enable signal WTEN to a low level regardless of the write command signal WT. Accordingly, even when a false write command signal FWT is inputted at the time t6, the write enable signal WTEN maintains a low-level deactivation state, thus a probability of the occurrence of a malfunction may decrease.

When the write command signal WT is inputted at time t11 after the first write control signal WTCONT1 changes to a high level, the write enable signal generating unit 12 activates the write enable signal WTEN to a high level. That is, because the semiconductor memory device completes a read operation, the write enable signal generating unit 12 receives the write command signal WT and activates the write enable signal WTEN to a high level. Thus, data DQ5, . . . , DQ8 are sequentially inputted by a write strobe signal WDQS inputted in response to the write enable signal WTEN activated to a high level.

As described above, the semiconductor memory device according to this embodiment maintains the low-level state of the write enable signal WETN in order not to perform a write operation, even when a false write command signal is inputted during the read operation of the semiconductor memory device, the probability of the occurrence of a malfunction may decrease.

Figure 9:
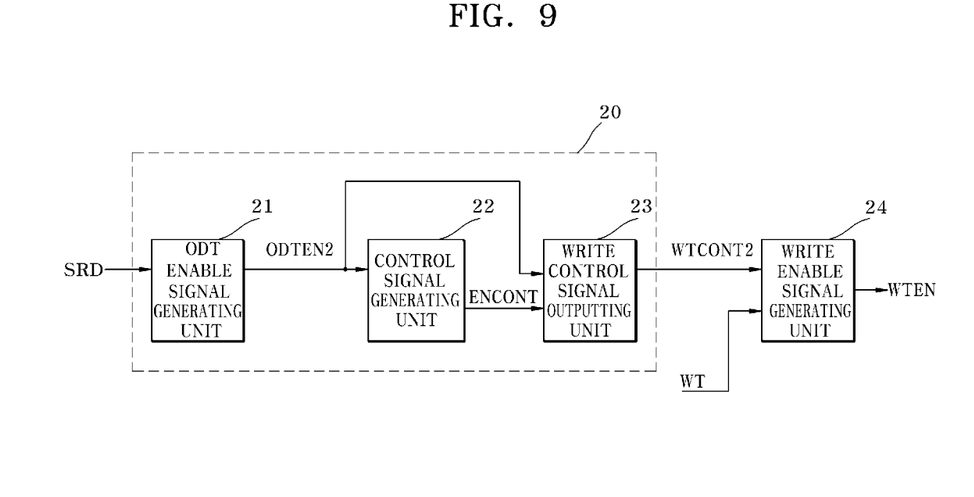
FIG. 9 is a block diagram of a semiconductor memory device according to another embodiment of the present invention.
Figure 10:
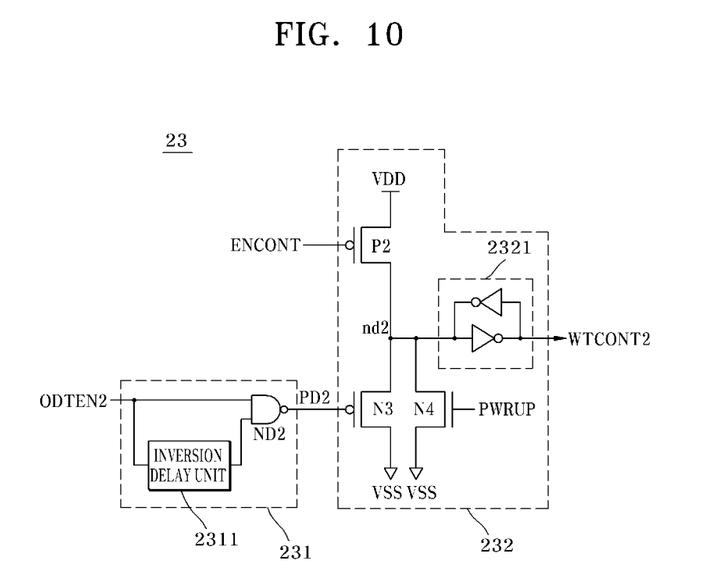
FIG. 10 is an circuit diagram of a write control signal outputting unit included in the semiconductor memory device illustrated in FIG. 9.
Figure 11:
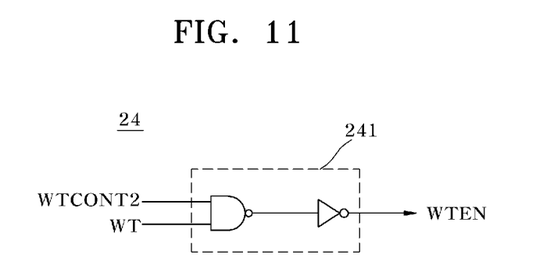
FIG. 11 is an circuit diagram of a write enable signal generating unit included in the semiconductor memory device illustrated in FIG. 9.
Figure 12:
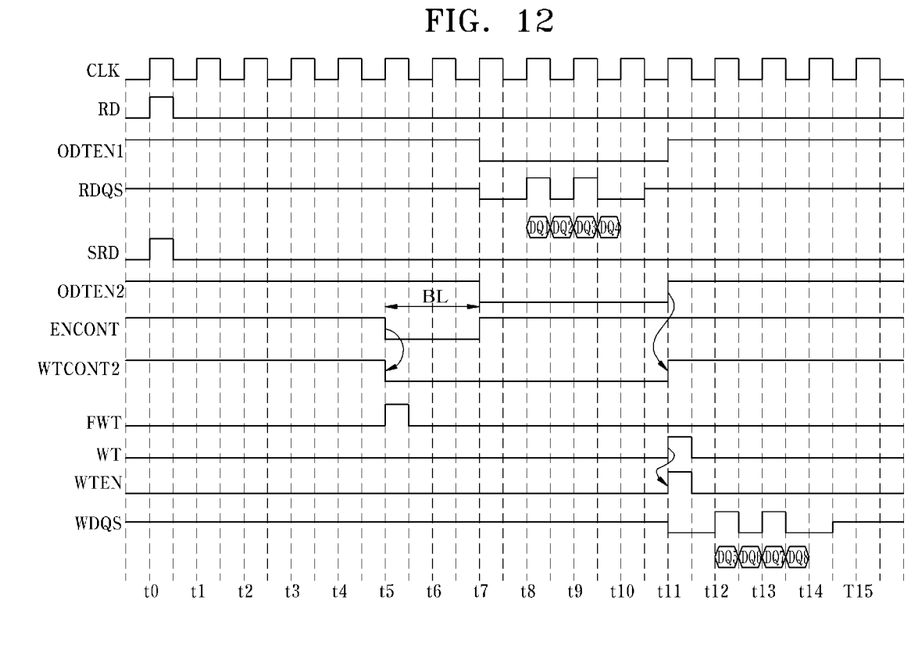
FIG. 12 is a timing diagram illustrating an operation of the semiconductor memory device illustrated in FIG. 9.

FIG. 9 is a block diagram of a semiconductor memory device according to another embodiment of the present invention. FIG. 10 is an circuit diagram of a write control signal outputting unit included in the semiconductor memory device illustrated in FIG. 9. FIG. 11 is an circuit diagram of a write enable signal generating unit included in the semiconductor memory device illustrated in FIG. 9. FIG. 12 is a timing diagram illustrating an operation of the semiconductor memory device illustrated in FIG. 9.

Referring to FIG. 9, a semiconductor memory device according to another embodiment of the present invention includes a write control signal generating circuit 20 and a write enable signal generating unit 24. The write control signal generating circuit 20 includes an ODT enable signal generating unit 21, a control signal generating unit 22, and a write control signal outputting unit 23.

The ODT enable signal generating unit 21 generates a second ODT enable signal ODTEN2 that is deactivated to a low level during a certain time period in response to a snoop read command SRD. The second ODT enable signal ODTEN2 is deactivated to a low level at the time point after a time period set according to a Column Address Strobe (CAS) latency CL from the input time point of the snoop read command SRD. In order to secure a data output margin in a read operation, the low-level second ODT enable signal ODTEN2 is activated to a high level at the time point, after a time period set according to a burst length BL plus a 2tCK time period, from the time point of the deactivation to a low level. For example, if the CAS latency CL is set to '3' and the burst length BL is set to '4', the second ODT enable signal ODTEN2 is deactivated to a low level at the time point after a 3tCK time period from the input time point of the snoop read command SRD, and is activated to a high level at the time point after a 2tCK time period set by the burst length BL plus a 2tCK time period set for a data output margin from the time point of the deactivation to a low level. In the case of DDR2, if the burst length is set to '4', data are inputted/outputted during a 2tCK time period of clock signal.

The control signal generating unit 22 generates a control signal ENCONT that maintains a low level during a data output time period corresponding to the burst length BL before the time point of the deactivation of the second ODT enable signal ODTEN2 to a low level. For example, if the burst length BL is se to '4', because data are inputted/outputted during a 2tCL time period of clock signal, the control signal ENCONT during a 2tCK time period before the time point of the deactivation of the second ODT enable signal ODTEN2 to a low level. According to an embodiment, the enable time period of the control signal ENCONT may be controlled such that the low-level time periods of the second ODT enable signal ODTEN2 and the control signal ENCONT overlap each other.

Referring to FIG. 10, the write control signal outputting unit 23 includes a pull-down signal generating unit 231 and a first driving unit 232. The pull-down signal generating unit 231 is configured to generate a second pull-down signal PD2 in response to the second ODT enable signal ODTEN2. The first driving unit 232 is configured to drive a node nd2 in response to the control signal ENCONT and the second pull-down signal PD2, and output a write control signal WTCONT.

The pull-down signal generating unit 231 includes an inversion delay unit 2311 and a second NAND gate ND2. The inversion delay unit 2311 is configured to invert and delay the second ODT enable signal ODTEN2. The second NAND gate ND2 is configured to perform a logical NAND operation on the second ODT enable signal ODTEN2 and the output signal of the inversion delay unit 2311, and output the second pull-down signal PD2. Thus, the pull-down signal generating unit 231 generates the second pull-down signal PD2 that maintains a low level from the time point of the transition of the second ODT enable signal ODTEN2 from low level to high level, to the time point after a delay time period of the inversion delay unit 2311.

The driving unit 232 includes a PMOS transistor P2 and an NMOS transistor N3. The PMOS transistor P2 operates as a pull-up driving element that is coupled between a power supply voltage VDD and a node nd2, and pulls up the voltage of the node nd2 in response to the control signal ENCONT. The NMOS transistor N3 operates as a pull-down driving element that is coupled between a ground voltage VSS and the node nd2, and pulls down the voltage of the node nd2 in response to the second pull-down signal P21. The driving unit 232 further includes an NMOS transistor N4 and a latch unit 2321. The NMOS transistor N4 operates as a pull-down driving element that is coupled between the ground voltage VSS and the node nd2, and pulls down the voltage of the node nd2 in response to a power-up signal PWRUP. The latch unit 2321 is configured to latch the output signal of the node nd2.

Thus, the write control signal outputting unit23 generates the second write control signal WTCONT2 that has a low level from the time point of the transition of the control signal ENCONT to a low level to the time point of the transition of the second ODT enable signal ODTEN2 to a high level.

Referring to FIG. 11, the write enable signal generating unit 24 includes a logic unit 241. The logic unit 241 is configured to perform a logical AND operation on a write command signal WT and the second write control signal WTCONT2, and output a write enable signal WTEN. Thus, during the low-level time period of the second write control signal WTCONT2, the write enable signal generating unit 24 does not generate the write enable signal WTEN activated to a high level, even when the write command WT is inputted.

An operation of the above semiconductor memory device will be described below with reference to FIGS. 9 to 12. Here, it is assumed that the CAS latency CL is set to '7' and the burst length BL is set to '4'.

The semiconductor memory device of this embodiment may be included in an integrated circuit that shares a memory controller with the semiconductor memory device of FIG. 5. The semiconductor memory device of FIG. 5 sharing a memory controller receives the read command RD at time t0, generates the first ODT enable signal ODTEN1 deactivated to a low level during a time period from a time t7 to a time t11, and outputs data DQ1, . . . , DQ4 sequentially in synchronization with a rising edge and a falling edge of the read data strobe signal RDQS.

Referring to FIGS. 9 to 12, a snoop read command SRD is inputted into the semiconductor memory device of this embodiment in synchronization with the read command RD inputted at time t0. When the snoop read command SRD is inputted at time t0, the second ODT enable signal ODTEN2 generated by the ODT enable signal generating unit 21 is deactivated to a low level during a time period from the time t7 to the time t11.

The control signal generating unit 22 generates the control signal ENCONT that maintains a low level during a data output time period corresponding to the burst length BL before the activation time point of the second ODT enable signal ODTEN2. When the burst length BL is set to '4', the control signal ENCONT maintains a low level during a time period from the time t5 to the time t7.

The write control signal outputting unit 23 generates the second write control signal WTCONT2 that has a low level from the time point t5 of the transition of the control signal ENCONT to a low level to the time point ti1 of the transition of the second ODT enable signal ODTEN2 from low level to high level.

During the low-level time period of the second write control signal WTCONT2, the write enable signal WTEN is not activated to a high level even when the write command signal WT is inputted. That is, during the low-level time period of the second write control signal WTCONT2, the write enable signal generating unit 24 deactivates the write enable signal WTEN to a low level regardless of the write command signal WT. Accordingly, even when a false write command signal FWT is inputted at time t5, the write enable signal WTEN maintains a low-level deactivation state, thus a probability of the occurrence of a malfunction may.

When the write command signal WT is inputted at time ti1 after the second write control signal WTCONT2 changes to a high level, the write enable signal generating unit 24 activates the write enable signal WTEN to a high level. Accordingly, data DQ5, . . . , DQ8 are sequentially inputted by a write strobe signal WDQS inputted in response to the write enable signal WTEN activated to a high level.

The semiconductor memory devices described above are used in an integrated circuit that includes semiconductor memory devices sharing a memory controller. That is, an integrated circuit may be configured such that the semiconductor memory device of FIG. 5 and the semiconductor memory device of FIG. 9 may share the memory controller. In such an integrated circuit, the semiconductor memory devices are substantially prevented from performing a write operation while a semiconductor memory device is performing a read operation. Accordingly, it is possible to substantially prevent the occurrence of a malfunction that performs a write operation during the performance of a read operation even when a false write command is inputted due to a channel/power noise during the performance of the read operation.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
   a write control signal generating circuit configured to generate a write control signal activated during a time period from an input time point of a read command to an end time point of a data output time period; and
   a write enable signal generating unit configured to output a write command as a write enable signal in response to the write control signal,
   wherein the end time point of the data output time period is determined by an On Die Termination (ODT) enable signal that is deactivated to interrupt an operation of an ODT circuit during a first time period set according to a Column Address Strobe (CAS) latency and a burst length.

2. The semiconductor memory device of claim 1, wherein the write control signal generating circuit comprises:
   an ODT enable signal generating unit configured to receive the read command and generate the ODT enable signal; and
   a write control signal outputting unit configured to receive the read command and the ODT enable signal, and generate the write control signal.

3. The semiconductor memory device of claim 2, wherein the ODT enable signal generating unit is configured to generate the ODT enable signal that is deactivated during a time period set according to a burst length after a time period corresponding to the CAS latency from the input time point of the read command.

4. The semiconductor memory device of claim 2, wherein the write control signal outputting unit is configured to generate the write control signal that is activated from an input time point of the read command to an end time point of a deactivation time period of the ODT enable signal.

5. The semiconductor memory device of claim 4, wherein the write control signal outputting unit comprises:

a pull-down signal generating unit configured to generate a pull-down signal in response to the ODT enable signal; and a driving unit configured to drive a node in response to the read command and the pull-down signal.

6. The semiconductor memory device of claim 5, wherein the pull-down signal generating unit is configured to generate the pull-down signal that is activated at the end time point of the deactivation time period of the ODT enable signal.

7. The semiconductor memory device of claim 5, wherein the pull-down signal generating unit comprises:

an inversion delay unit configured to invert and delay the ODT enable signal; and a logic element configured to perform a logical operation on the ODT enable signal and the output signal of the inversion delay unit, and output the pull-down signal.

8. The semiconductor memory device of claim 5, wherein the driving unit comprises:

a pull-up driving element configured to pull up the voltage of the node in response to the buffered read command signal;

a pull-down driving element configured to pull down the voltage of the node in response to the pull-down signal; and a latch unit configured to latch the signal of the node and output the write control signal.

9. The semiconductor memory device of claim 1, wherein the write enable signal generating unit is configured to deactivate the write enable signal even when the write command is inputted during an activation time period of the write control signal.

* * * * *